(12) United States Patent
Sakaguchi

(10) Patent No.: US 6,480,011 B2
(45) Date of Patent: Nov. 12, 2002

(54) SCREENING OF SEMICONDUCTOR INTEGRATED CIRCUIT DEVICES

(75) Inventor: Kazuhiro Sakaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/859,478

(22) Filed: May 18, 2001

(65) Prior Publication Data

US 2001/0043079 A1 Nov. 22, 2001

(30) Foreign Application Priority Data

May 19, 2000 (JP) ........................................ 2000-148304

(51) Int. Cl.[7] .............................................. G01R 31/28
(52) U.S. Cl. .................... 324/752; 324/753; 324/158.1; 324/760; 324/765
(58) Field of Search ............................... 324/158.1, 752, 324/751, 753, 760, 765, 763, 501

(56) References Cited

U.S. PATENT DOCUMENTS

| | | | |
|---|---|---|---|
| 5,847,573 A | * | 12/1998 | How et al. .................. 324/765 |
| 6,081,127 A | * | 6/2000 | Wagner et al. .............. 324/752 |
| 6,118,277 A | * | 9/2000 | Takeuchi et al. ............ 324/752 |
| 6,252,387 B1 | * | 6/2002 | Takeuchi et al. ............ 324/753 |

OTHER PUBLICATIONS

Hnatek, Eugene R., "Integrated Circuit Quality and Reliability", M.Dekker, NY 1995, pp. 719–720.

* cited by examiner

Primary Examiner—Michael Sherry
Assistant Examiner—Jimmy Nguyen
(74) Attorney, Agent, or Firm—Foley & Lardner

(57) ABSTRACT

A method of screening LSIs is provided, which makes it possible to screen out faulty LSIs before potential failure existing therein is elicited. A specific power supply voltage is supplied to LSIs to be tested while applying a specific test signal to the LSIs at a specific period. Power supply currents of the LSIs are observed. Sets of power spectrum data of the power supply currents are generated corresponding to the test signal. The distributions of the sets of power spectrum data are generated. whether or not the distributions of the sets of power spectrum data of the power supply currents are equal to or greater than a specific reference value is judged. When the distribution of the set of power spectrum data of the power supply current of one of the devices is equal is to or greater than the reference value, the device in question is regarded as a faulty one.

19 Claims, 9 Drawing Sheets

FIG. 6

| SAMPLES | FUNDAMENTAL & HARMONIC FREQUENCIES | | | | | | | | | |
|---|---|---|---|---|---|---|---|---|---|---|
| | 1st | 2nd | 3rd | 4th | 5th | 6th | 7th | 8th | 9th | 10th |
| samp01 | -15.13 | -14.06 | -13.12 | -18.14 | -17.62 | -16.98 | -15.36 | -20.66 | -18.91 | -15.78 |
| samp02 | -15.12 | -14.06 | -13.13 | -18.37 | -17.63 | -16.95 | -15.33 | -20.7 | -18.88 | -15.81 |
| samp03 | -15.14 | -14.05 | -13.1 | -18.45 | -17.65 | -17 | -15.38 | -20.68 | -18.91 | -15.78 |
| samp04 | -15.16 | -14.06 | -13.11 | -18.4 | -17.64 | -16.96 | -15.37 | -20.62 | -16.66 | -15.6 |
| samp05 | -15.14 | -14.05 | -13.12 | -18.36 | -17.6 | -16.98 | -15.37 | -20.6 | -18.88 | -15.8 |
| samp06 | -15.14 | -14.06 | -13.11 | -18.46 | -17.64 | -16.99 | -15.35 | -20.6 | -18.9 | -15.77 |
| samp07 | -15.1 | -14.03 | -13.09 | -18.43 | -17.6 | -16.97 | -15.36 | -20.66 | -18.89 | -15.79 |
| samp08 | -15.12 | -14.04 | -13.09 | -18.41 | -17.62 | -16.95 | -15.35 | -20.59 | -18.84 | -15.79 |
| samp09 | -15.13 | -14.04 | -13.11 | -18.38 | -17.61 | -16.95 | -15.35 | -20.61 | -18.85 | -15.79 |
| samp10 | -15.12 | -14.05 | -13.11 | -18.38 | -17.63 | -16.95 | -15.34 | -20.62 | -18.86 | -15.79 |
| samp11 | -15.13 | -14.04 | -13.1 | -18.42 | -17.65 | -16.99 | -15.36 | -20.68 | -18.9 | -15.79 |
| samp12 | -15.17 | -14.07 | -13.13 | -18.43 | -17.62 | -16.99 | -15.36 | -20.66 | -18.88 | -15.78 |
| samp13 | -15.15 | -14.05 | -13.12 | -18.35 | -17.6 | -16.96 | -15.35 | -20.63 | -18.87 | -15.77 |
| samp14 | -15.15 | -14.04 | -13.1 | -18.38 | -17.62 | -16.97 | -15.36 | -20.61 | -18.86 | -15.8 |
| samp15 | -15.15 | -14.04 | -13.11 | -18.39 | -17.61 | -16.96 | -15.35 | -20.67 | -18.87 | -15.79 |
| samp16 | -15.11 | -14.03 | -13.09 | -18.39 | -17.63 | -16.97 | -15.34 | -20.64 | -18.87 | -15.8 |
| samp17 | -15.11 | -14.04 | -13.1 | -18.41 | -17.61 | -16.97 | -15.35 | -20.66 | -18.91 | -15.8 |
| samp18 | -15.11 | -14 | -13.08 | -18.41 | -17.61 | -17 | -15.37 | -20.69 | -18.95 | -15.82 |
| samp19 | -15.12 | -14.04 | -13.09 | -18.45 | -17.62 | -16.97 | -15.35 | -20.64 | -18.89 | -15.79 |
| samp20 | -15.15 | -14.05 | -13.12 | -18.44 | -17.64 | -17 | -15.36 | -20.66 | -18.9 | -15.78 |
| samp21 | -15.1 | -14.04 | -13.1 | -18.36 | -17.62 | -16.96 | -15.34 | -20.65 | -18.89 | -15.8 |
| samp22 | -14.73 | -14.57 | -12.81 | -18.34 | -17.59 | -16.27 | -15.36 | -20.74 | -19.14 | -15.48 |
| samp23 | -15.15 | -14.04 | -13.13 | -18.39 | -17.61 | -16.96 | -15.37 | -20.62 | -18.88 | -15.81 |
| samp24 | -15.15 | -14.05 | -13.11 | -18.4 | -17.63 | -16.97 | -15.35 | -20.68 | -18.89 | -15.76 |
| samp25 | -15.15 | -14.04 | -13.12 | -18.37 | -17.62 | -16.97 | -15.36 | -20.62 | -18.87 | -15.81 |
| samp26 | -15.14 | -14.03 | -13.07 | -18.38 | -17.63 | -16.98 | -15.34 | -20.68 | -18.9 | -15.77 |
| samp27 | -15.14 | -14.06 | -13.1 | -18.46 | -17.66 | -16.99 | -15.36 | -20.67 | -18.9 | -15.81 |
| samp28 | -15.14 | -14.05 | -13.12 | -18.41 | -17.66 | -16.98 | -15.36 | -20.66 | -18.88 | -15.8 |
| samp29 | -15.14 | -14.04 | -13.11 | -18.38 | -17.58 | -16.97 | -15.35 | -20.61 | -18.86 | -15.77 |
| samp30 | -15.16 | -14.07 | -13.13 | -18.43 | -17.65 | -17 | -15.35 | -20.73 | -18.92 | -15.79 |
| samp31 | -15.17 | -14.07 | -13.11 | -18.4 | -17.66 | -16.97 | -15.36 | -20.67 | -18.91 | -15.8 |
| samp32 | -15.13 | -14.05 | -13.11 | -18.4 | -17.61 | -16.97 | -15.34 | -20.67 | -18.9 | -15.8 |
| samp33 | -15.1 | -14.03 | -13.08 | -18.41 | -17.63 | -16.95 | -15.37 | -20.57 | -18.83 | -15.8 |
| MEAN | -15.12 | -14.06 | -13.1 | -18.4 | -17.63 | -16.95 | -15.36 | -20.65 | -18.89 | -15.78 |
| STANDARD DEVIATION | 0.073 | 0.093 | 0.054 | 0.031 | 0.021 | 0.124 | 0.038 | 0.038 | 0.05 | 0.055 |

SCREENING OF SEMICONDUCTOR INTEGRATED CIRCUIT DEVICES

BACKGROUND OF THE INVENTION

1. Field of the Invention

The present invention relates to a screening technique of semiconductor integrated circuit devices, e.g., Large-Scale Integrated circuit devices (LSIs). More particularly, the invention relates to a method of and an apparatus for screening semiconductor integrated circuit devices that screen out faulty devices (i.e., LSIs with some early failure), and a computer program product having a computer readable medium and a computer program recorded thereon that performs the method.

2. Description of the Related Art

Conventionally, the "burn-in" test or procedure has been well known and actually performed as a method of screening out defective LSIs with some early failure. This test or procedure is explained in detail, for example, in a book entitled "Integrated Circuit Quality and Reliability" written by Eugene R. Hnatek, pp. 719–720. This is a method to deliberately apply electrical stress to LSIs to be tested in a high-temperature environment, thereby making temperature-dependent potential failures obvious in a comparatively short period of time. This is carried out to screen out faulty LSIs with some potential failure in an early stage, thereby improving the reliability of LSIs.

As explained above, the burn-in test is one of the accelerated tests capable of eliciting the potential failure of LSIs in a comparatively short period of time. However, this test has a disadvantage that it may take a long time such as several hundreds or several thousands hours to complete the test when the type of failure modes to be elicited is time-consuming and/or the required level of reliability is high. Thus, there is the need to make it possible to screen out defective or faulty LSIs with some potential failure in a sufficiently short period of time.

Moreover, the burn-in test has a danger that the potential failure of LSIs is unable to be found or observed, which is due to the following reason. Specifically,. potential defects or failures existing in LSIs degrade gradually with time due to applied stresses in the burn-in test. These defects or failures are not found or observed unless they are completely elicited during the test. Thus, there is a possibility that the potential defects or failures in LSIs are not found even if the test is finished.

SUMMARY OF THE INVENTION

Accordingly, an object of the present invention is to provide a method of screening semiconductor integrated circuit devices that makes it possible to screen out faulty devices before potential failure existing therein through a burn-in test is elicited, and a computer program product that performs the method.

Another object of the present invention is to provide an apparatus for screening semiconductor integrated circuit devices capable of screening out faulty devices before potential failure existing therein is elicited through a burn-in test.

Still another object of the present invention is to provide a method of screening semiconductor integrated circuit devices that screens out faulty devices with potential failure in a short period of time, and a computer program product that performs the method.

A further object of the present invention is to provide an apparatus for screening semiconductor integrated circuit devices capable of screening out faulty devices with potential failure in a short period of time.

The above objects together with others not specifically mentioned will become clear to those skilled in the art from the following description.

According to a first aspect of the present invention, a method of screening semiconductor integrated circuit devices is provided This method comprises the steps of:

(a) supplying a specific power supply voltage to semiconductor integrated circuit devices to be tested while applying a specific test signal to the devices at a specific period;

(b) observing power supply currents of the devices caused by the power supply voltage and the test signal;

(c) generating sets of power spectrum data of the power supply currents of the devices corresponding to the test signal;

(d) generating distributions of the sets of power spectrum data of the power supply currents; and (e) judging whether or not the distributions of the sets of power spectrum data of the power supply currents are equal to or greater than a specific reference value;

wherein when the distribution of the set of power spectrum data of the power supply current of one of the devices is equal to or greater than the reference value, the device in question is regarded as a faulty one, With the method according to the first aspect of the present invention, a specific power supply voltage is supplied to semiconductor integrated circuit devices to be tested while applying a specific test signal to the devices at a specific period in the step (a). Then, power supply currents of the devices caused by the power supply voltage and the test signal are observed in the step (b). Sets of power spectrum data of the power supply currents of the devices corresponding to the test signal are generated in the step (c). Distributions of the sets of power spectrum data of the power supply currents are generated in the step (d). Finally, whether or not the distributions of the sets of power spectrum data of the power supply currents are equal to or greater than a specific reference value is judged in the step (e).

Thus, when the distribution of the set of power spectrum data of the power supply current of one of the devices is equal to or greater than the reference value, the device in question is regarded as a faulty or good one. As a result, faulty devices can be screened out before potential failure existing therein through a burn-in test is elicited.

Moreover, since no burn-in test is necessary, faulty devices with potential failure can be screened out in a short period of time.

In a preferred embodiment of the method according to the first aspect, further comprising a step of performing a burn-in test for the devices prior to the step (a). In this embodiment, there is an additional advantage that faulty devices can be screened out more accurately than the case where no burn-in test is carried out prior to the step (a).

In another preferred embodiment of the method according to the first aspect, the test signal includes a single set of test patterns, or sets of test patterns that are consecutively arranged with time, or sets of test patterns that are consecutively arranged with time at specific intervals.

According to a second aspect of the present invention, another method of screening semiconductor integrated circuit devices is provided. This method comprises the steps of:

(a) supplying a specific power supply voltage to semiconductor integrated circuit devices to be tested while applying a specific test signal to the devices at a specific period;

(b) observing power supply currents of the devices caused by the power supply voltage and the test signal;

(c) generating sets of power spectrum data of the power supply currents of the devices corresponding to the test signal;

(d) generating distributions of the sets of power spectrum data of the power supply currents before a burn-in test;

(e) performing the steps (a) to (d) while performing a burn-in test for the devices after the step (d), generating distributions of the sets of power spectrum data of the power supply currents during the burn-in test;

(f) performing the steps (a) to (d) after the burn-in test is completed in the step (e), generating distributions of the sets of power spectrum data of the power supply currents after the burn-in test;

(g) generating distribution change rates of power spectrum data of the power supply currents based on the distributions of the sets of power spectrum data of the power supply currents obtained in the steps (d), (e), and (f); and (h) judging whether or not the distribution change rates of power spectrum data of the power supply currents generated in the step (g) are equal to or greater than a specific reference value;

wherein when the distribution change rate of power spectrum data of the power supply current of one of the devices is equal to or greater than the reference value, the device in question is regarded as a faulty one.

With the method according to the second aspect of the present invention, before the burn-in test, the steps (a) to (d) are tarried out, generating the distributions of the sets of power spectrum data of the power supply currents before a burn-in test. Thereafter, the steps (a) to (d) are performed in the step (e) while performing a burn-in test for the devices after the step (d), generating the distributions of the sets of power spectrum data of the power supply currents during the burn-in test. Further, the steps (a) to (d) are performed after the burn-in test is completed in the step (e), generating the distributions of the sets of power spectrum data of the power supply currents after the burn-in test. Finally, the distribution change rates of power spectrum data of the power supply currents are generated in the step (g) based on the distributions of the sets of power spectrum data of the power supply currents obtained in the steps (d), (e), and (f).

The good devices have small time-dependent change rates of the power spectrum data, because they include no potential fault or defect and therefore, they scarcely degrade in performance even after the burn-in test is completed. In contrast, the faulty devices have large change rates of the power spectrum data, because the faulty devices include some potential fault or defect and therefore, they distinctly degrade in performance after the burn-in test is completed.

Accordingly, by judging whether or not the distribution change rates of power spectrum data of the power supply currents generated in the step (g) are equal to or greater than a specific reference value in the step (h), the device in question can be found as a faulty or good one.

In a preferred embodiment of the method according to the second aspect, the test signal includes a single set of test patterns, or sets of test patterns that are consecutively arranged with time, or sets of test patterns that are consecutively arranged with time at specific intervals.

According the a third aspect of the present invention, an apparatus for screening semiconductor integrated circuit devices is provided. This apparatus comprises:

(a) a test power supply for generating a power supply voltage applied to semiconductor integrated circuit devices to be tested;

(b) a test signal generator for generating a test signal supplied to the devices;

(c) a spectrum analyzer for observing power supply currents of the devices caused by the power supply voltage and the test signal and for generating sets of power spectrum data of the power supply currents of the devices corresponding to the test signal;

(d) a data storage for storing the sets of power spectrum data of the power supply currents of the devices; and (e) a data analyzer for generating distributions of the sets of power spectrum data of the power supply currents and for judging whether or not the distributions of the sets of power spectrum data of the power supply currents are equal to or greater than a specific reference value;

wherein when the distribution of the set of power spectrum data of the power supply current of one of the devices is equal to or greater than the reference value, the device in question is regarded as a faulty one.

With the apparatus according to the third aspect of the present invention, the method of the first or second aspect of the invention can be carried out. Therefore, there are the same advantages as those in the method of the first aspect of the invention.

According to a fourth aspect of the present invention, a computer program product having a computer readable medium and a computer program recorded thereon is provided The computer program is operable to screen semiconductor integrated circuit devices. This product is to perform the method of the first aspect of the invention.

This product comprises:

(a) code that supplies a specific power supply voltage to semiconductor integrated circuit devices to be tested while applying a specific test signal to the devices at a specific period;

(b) code that observes power supply currents of the devices caused by the power supply voltage and the test signal;

(c) code that generates sets of power spectrum data of the power supply currents of the devices corresponding to the test signal;

(d) code that generates distributions of the sets of power spectrum data of the power supply currents; and (e) code that judges whether or not the distributions of the sets of power spectrum data of the power supply currents are equal to or greater than a specific reference value;

wherein when the distribution of the set of power spectrum data of the power supply current of one of the devices is equal to or greater than the reference value, the device in question is regarded as a faulty one.

According to a fifth aspect of the present invention, another computer program product having a computer readable medium and a computer program recorded thereon is provided, The computer program is operable to screen semiconductor integrated circuit devices. This product is to perform the method of the second aspect of the invention.

This product comprises:

(a) code that supplies a specific power supply voltage to semiconductor integrated circuit devices to be tested while applying a specific test signal to the devices at a specific period;

(b) code that observes power supply currents of the devices caused by the power supply voltage and the test signal;

(c) code that generates sets of power spectrum data of the power supply currents of the devices corresponding to the test signal;

(d) code that generates distributions of the sets of power spectrum data of the power supply currents before a burn-in test;

(e) code that performs the steps (a) to (d) while performing a burn-in test for the devices after the step (d), generating distributions of the sets of power spectrum data of the power supply currents during the burn-in test;

(f) code that performs the steps (a) to (d) after the burn-in test is completed in the step (e), generating distributions of the sets of power spectrum data of the power supply currents after the burn-in test;

(g) code that generates distribution change rates of power spectrum data of the power supply currents based on the distributions of the sets of power spectrum data of the power supply currents obtained in the steps (d), (e), and (f); and (h) code that judges whether or not the distribution change rates of power spectrum data of the power supply currents generated in the step (g) are equal to or greater than a specific reference value;

wherein when the distribution change rate of power spectrum data of the power supply current of one of the devices is equal to or greater than the reference value, the device in question is regarded as a faulty one.

BRIEF DESCRIPTION OF THE DRAWINGS

In order that the present invention may be readily carried into effect, it will now be described with reference to the accompanying drawings.

FIG. 6 is a table showing the measurement result of the power spectrum data of the power supply currents of the semiconductor integrated circuit devices under test obtained in the screening method according to the first embodiment.

DETAILED DESCRIPTION OF THE PREFERRED EMBODIMENTS

Figure 1:
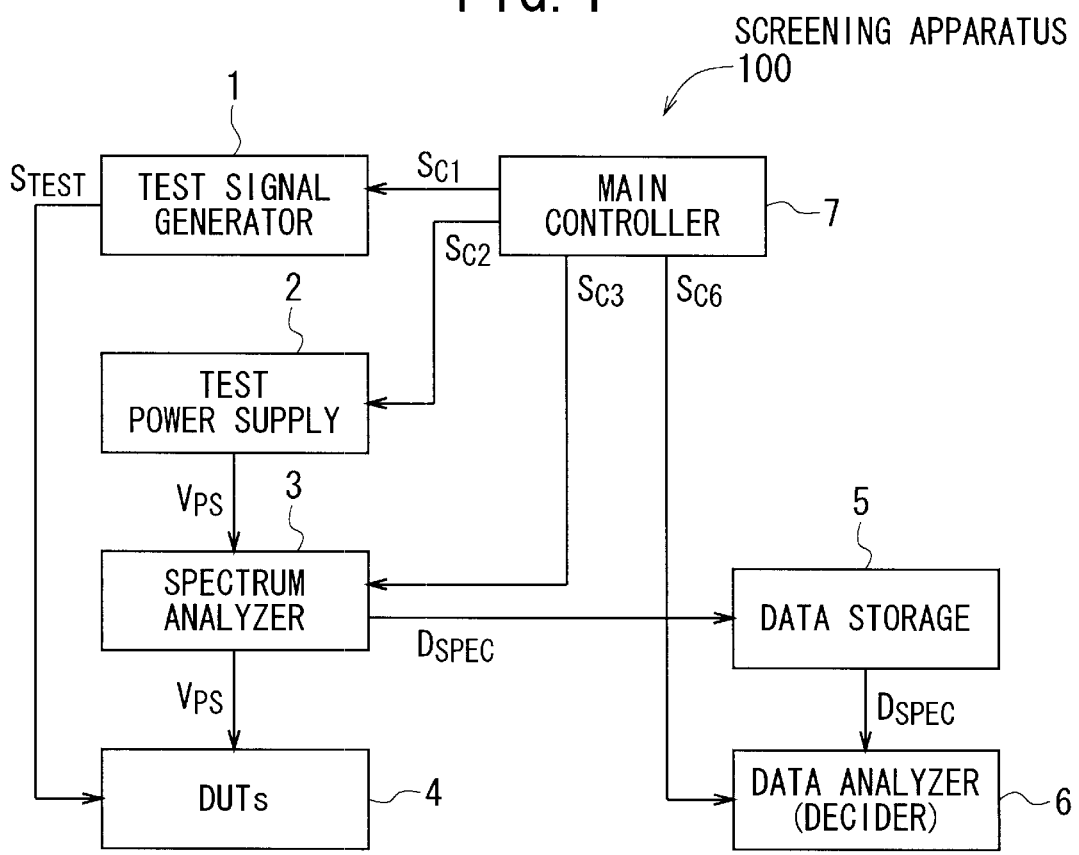
FIG. 1 is a functional block diagram showing the configuration of a screening apparatus according to a first embodiment of the invention.

Preferred embodiments of the present invention will be described in detail below while referring to the drawings attached.

FIRST EMBODIMENT

A screening apparatus according to a first embodiment of the invention has the configuration shown in FIG. 1, which is used to carry out a screening method according to the first embodiment.

Specifically, the screening apparatus 100 according to the first embodiment comprises a test signal generator 1, a test power supply 2, a spectrum analyzer 3, a data storage 5 a data analyzer or decider 6, and a main controller 7. Devices Under Test (DUTs) 4 are LSIs to be tested by the method of the first embodiment.

The test signal generator 1 generates a specific test signal $S_{TEST}$ and applies it to all the DUTs 4. The test power supply 3 supplies a specific power supply voltage $V_{ps}$ to all the DUTs 4 by way of the spectrum analyzer 3.

The spectrum analyzer 3 monitors or observes the power supply voltage $V_{PS}$ and the power supply currents flowing from the power supply 3 to the respective DUTs 4 corresponding to the test signal $S_{TEST}$ applied thereto. Then, the analyzer 3 forms or generates power spectrum data $D_{SPEC}$ each power supply current thus monitored or observed. Thereafter, the analyzer 3 sends the power spectrum data $D_{SPEC}$ thus generated to the data storage 5.

The data storage 5 receives the power spectrum data $D_{SPEC}$ of the power supply currents and stores it therein. The data analyzer 6 reads out the data $D_{SPEC}$ stored in the storage 5 according to the necessity.

The data analyzer or decider 6 reads out the power spectrum data $D_{SPEC}$ stored in the data storage 5 and analyzes it. Thus, the analyzer 6 decides or judges whether or not each of the DUTs 4 includes some potential fault and will fail in an early stage.

The main controller 7 controls the entire operation of the screening apparatus 100, i.e., the operations of the test signal generator 1, the test power supply 2, the spectrum analyzer 3 and the data analyzer 6 by way of control signals $S_{C1}$, $S_{C2}$, $S_{C1}$, and $S_{C6}$, respectively. The controller 7 is provided to perform the automatic screening operation by controlling the generator 1, the power supply 2, the spectrum analyzer 3 and the data analyzer 6. Therefore, the controller 7 is unnecessary unless the automatic screening operation is desired. For example, if a test person operates manually the generator 1, the power supply 2, the spectrum analyzer 3 and the data analyzer 6, the controller 7 can be eliminated.

Next, prior to explanation of the screening method according to the first embodiment, the principle of the method is explained below with reference to FIGS. 2 and 3.

Figure 2:
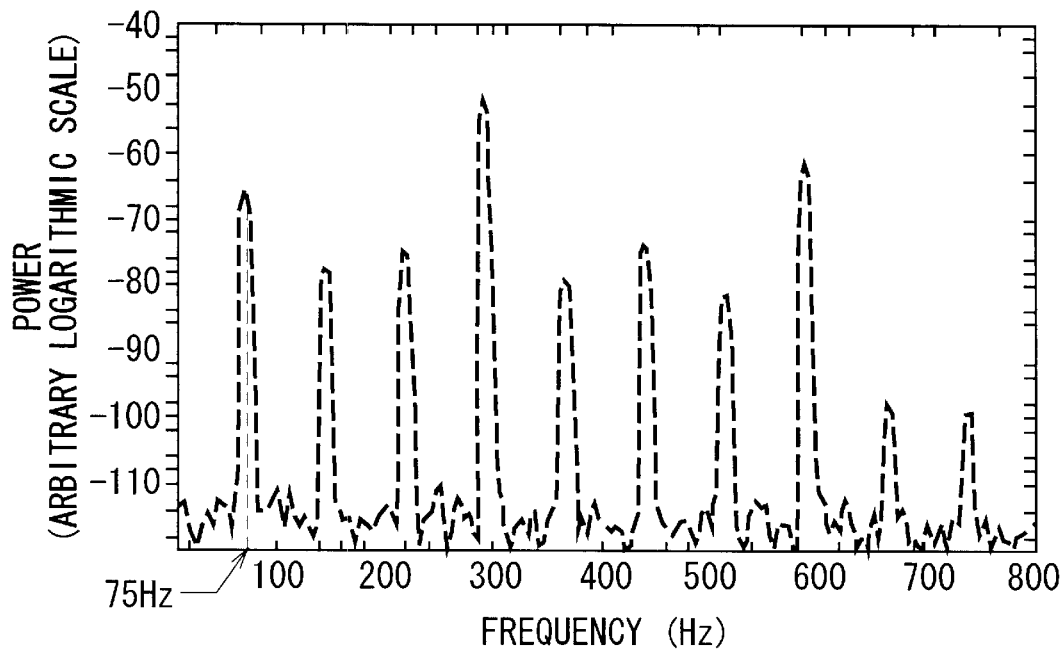
FIG. 2 is a graph showing an example of the power spectrum of the power supply current flowing into the semiconductor integrated circuit device under test in a burn-in test using the apparatus according to the first embodiment of FIG. 1.

FIG. 2 shows an example of the power spectrum of the power supply current flowing into one of the DUTs or LSIs 4, which was obtained by applying repeatedly the test signal $S_{TEST}$ to the respective DUTs 4 while the period T of the test signal $S_{TEST}$ (which includes a set of test patterns) was set as 13.3 milliseconds (ms) (i.e., T=13.3 ms). FIG. 3 shows an example of the distribution rate change as a function of dispersion of the power spectrum data $D_{SPEC}$ of one of the power supply currents.

The power supply current flowing into each of the DUTs 4 contains a lot of information reflecting the internal state of the DUT 4 serving as a load. In other words, if one of the DUTs 4 has a defect that leads to early failure (e.g., defective interconnections or wiring lines, defective transistors, and so on), the power supply current flows abnormally into the DUT 4 in question. The abnormal power supply current of a faulty LSI is usually discriminated clearly from the normal power supply current of a good LSI. Therefore, whether or not one of the DUTs or LSIs 4 is faulty can be recognized or determined by the fact whether or not it has an abnormal or unlike power supply current with respect to the normal power supply current. Based on this knowledge of the invention, the power spectrum data $D_{SPEC}$ of the power supply current of each DUT 4 is utilized in the screening method according to the first embodiment the invention.

Figures 5A, 5B, 5C:
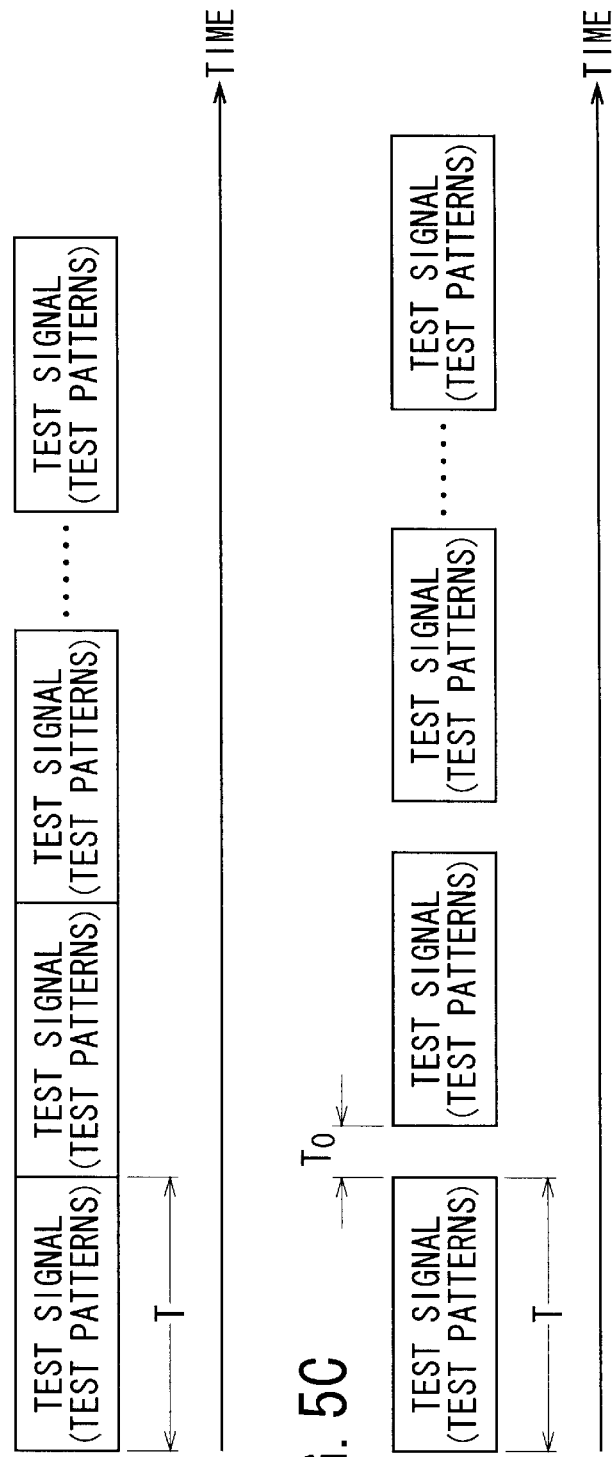
FIGS. 5A, 5B, and 5C are schematic views showing the test signal generated by the test signal generator in the screening apparatus according to the first embodiment of FIG. 1, respectively.

When the test signal $S_{TEST}$ including a set of specific test patterns (period: T) is commonly applied to the DUTs 4 periodically, as shown in FIG. 5A, the power supply current flowing into each of the DUTs 4 has the same period T. Therefore, for example, as shown in FIG. 2, the power spectrum of the power supply current includes the fundamental frequency (1/T=1/13.3 ms=75 Hz) and its harmonic frequencies of n times the fundamental frequency (1/T=75 Hz), where n is an integer equal to or greater than 2.

By the way, to discriminate the normal and abnormal power supply currents of the DUTs 4, power spectrum data of a good DUT or LSI 4 is required as a reference. However, obviously, it is extremely difficult to screen out good LSIs from the LSIs provided for the DUTs 4 (which may include at least one faulty LSI) prior to any testing procedure.

In the screening method of the first embodiment of the invention, a known fact that the count of faulty LSIs is usually small in a set of practical LSIs to be tested is utilized. In other words, a fact that most of the actual LSIs to be tested are good while a small fraction of the LSIs are faulty or defective and should be screened out is utilized.

Figure 3:
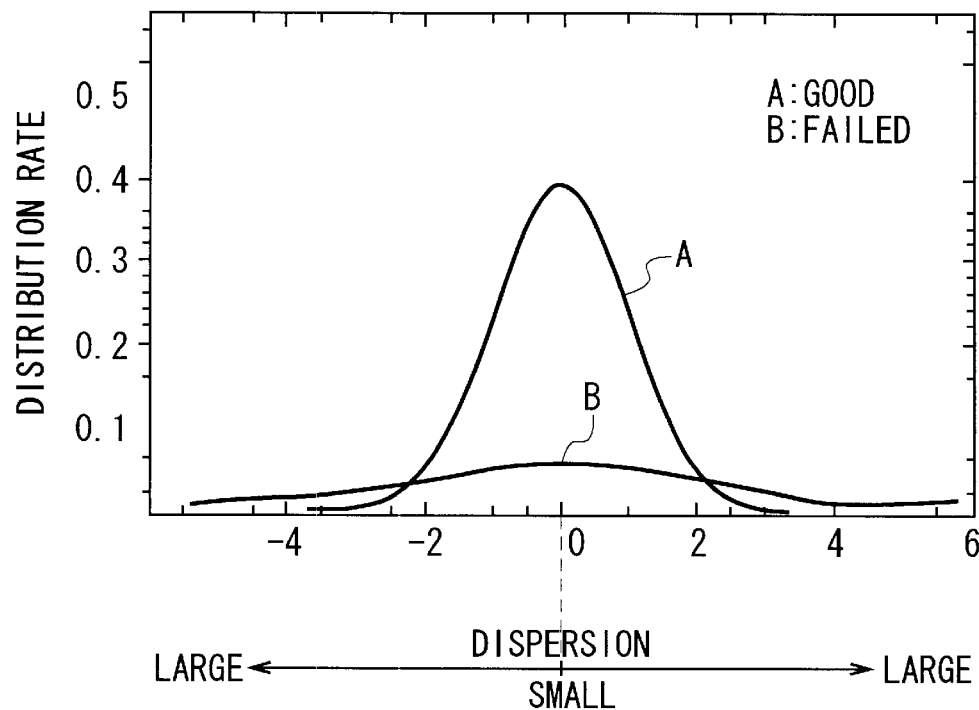
FIG. 3 is a graph showing an example of the dispersion or fluctuation of the power spectrum data of the power supply currents of the semiconductor integrated circuit devices under test obtained in the screening method according to the first embodiment of the invention.

As shown in FIG. 3, generally, the dispersion of the power spectrum data $D_{SPEC}$ of the power supply currents of good. LSIs tested (i. e. , the electric power values at the fundamental frequency and its harmonic frequencies, as shown in FIG. 2) has a normal distribution (curve A in FIG. 3), where the mean value of the dispersion (i.e., the dispersion value is 0) is placed at the center of the distribution curve A. This is due to the difference or fluctuation in electrical characteristics of the good LSIs tested. On the other hand, the dispersion of the power spectrum data $D_{SPEC}$ of the power supply currents of faulty LSIs tested has an abnormal distribution (curve B in FIG. 3), which is quite unlike the normal distribution A. This is due to the abnormal power supply currents of the faulty LSIs tested.

Accordingly, if the dispersion of the power spectrum data $D_{SPEC}$ of the power supply currents of the respective LSIs as the DUTs 4 is obtained, the dispersion of the faulty LSIs is quite different from that of the good LSIs. Based on this principle, in the screening method of the first embodiment, the distribution rate of the power spectrum data $D_{SPEC}$ of the power supply currents of the respective LSIs or DUTs 4 is calculated and then, it is compared with a specific reference value as the decision or judgment reference. Thereafter the DUTs 4 or LSIs whose dispersion values are greater than the reference value are decided or judged as faulty ones.

Next, the screening method of the first embodiment is explained in detail below with reference to FIG. 4 and FIGS. 5A to 5C.

Figure 4:
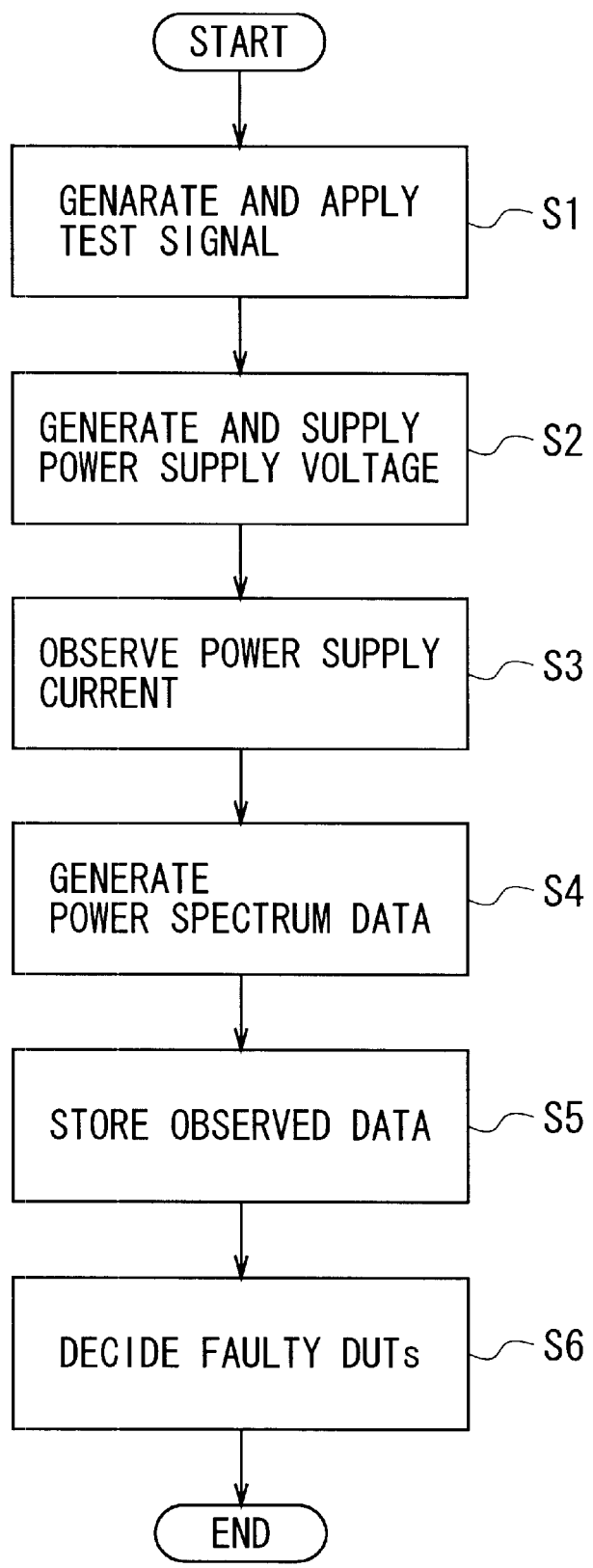
FIG. 4 is a flowchart showing the process steps of the screening method according to the first embodiment of the invention

As shown in FIG. 4, in the step S1, the test signal generator 1 generates the test signal $S_{TEST}$ including the specific test patterns and applies commonly the signal $S_{TEST}$ thus generated to the respective DUTs 4 by way of their input terminals (not shown). This operation is carried out under the control of the main controller 7.

The test signal $S_{TEST}$ may be in the torn of FIGS. 5A to 5C. In the form of FIG. 5A, the test signal $S_{TEST}$ includes a single set of test patterns with the period T. In the form of FIG. 5B, the test signal $S_{TEST}$ includes a plurality sets of the same test patterns as shown in FIG. 5A, where the sets of the test patterns are consecutively applied to the DUTs 4. In the form of FIG. 5C, the test signal $S_{TEST}$ includes a plurality sets of the same test patterns as shown in FIG. 5A, where the sets of the test patterns are repeatedly applied to the DUTs 4 at a quiescent period (i.e., an interval) $T_0$.

In the step 32, the test power supply 2 generates the power supply voltage $V_{PS}$ and supplies it to the respective DUTs 4 by way of the spectrum analyzer 3 under the control of the main controller 7. The voltage $V_{PS}$ is applied to the DUTs 4 by way of their power supply terminals (not shown). The voltage $V_{PS}$ may be constant or fixed, or may vary temporarily according to any specific rule, or may vary temporarily to be synchronized with the test signal $S_{TEST}$.

In the step S3, the spectrum analyzer 3 observes or detects the power supply currents flowing from the power supply 2 to the respective DUTs 4 under the control of the main controller 7.

In the step S4, the spectrum analyzer 3 calculates to generate the power spectrum data $D_{SPEC}$ of the power supply currents on the basis of the data values of the power supply currents thus observed. Specifically, the spectrum analyzer 3 samples the data values of the power supply current of each DUT 4 at a predetermined sampling rate or timing and then, calculates the electric power values from the data values thus sampled with respect to each DUT 4. This calculation is performed with, for example, the Discrete Fourier Transform (DFT) or the Fast Fourier Transform (FFT).

When the test signal $S_{TEST}$ is in the form of FIG. 5A (i.e., includes a single set of test patterns), the power supply currents flowing into the DUTs 4 do not have periodicity. In this case, the period T of the signal $S_{TEST}$ is regarded as a repetition time length of the signal $S_{TEST}$, thereby forming the power spectrum data of the power supply current of each DUT 4. Alternately, the sum of the period T and a specific, constant time Ti subsequent to the signal $S_{TEST}$, i.e., (T+T1), is regarded as a repetition time length of the signal $S_{TEST}$, thereby forming the power spectrum data of the power supply current of each DUT 4 The power spectrum data of the current includes components at the fundamental frequency (1T) or [1/(T+T1) ] and its harmonic frequencies of n times the fundamental frequency.

When the test signal $S_{TEST}$ is in the form of FIG. 5B (i.e., includes a plurality sets of consecutive test patterns at no intervals), the power supply currents flowing into the DUTs 4 are repeated at the same period T. In this case, the power spectrum data of the power supply current of each DUT 4 includes the fundamental frequency (1/T) and its harmonic frequencies of n times the fundamental frequency.

When the test signal $S_{TEST}$ is in the form of FIG. 5C (i.e., includes a plurality sets of consecutive test patterns at specific intervals), the power supply currents flowing into the DUTs 4 are repeated at the period (T+$T_0$) In this case, the power spectrum data of the power supply current of each DUT 4 includes the fundamental frequency [1/(T+$T_0$) ] and its harmonic frequencies of n times the fundamental frequency.

In the step S5, the spectrum analyzer 3 sends the power spectrum data $D_{SPEC}$ thus formed in the step S4 to the data storage 5. Thus, the data $D_{SPEC}$ for the individual DUTs 4 are stored in the storage 5.

In the step S6, the data analyzer or decider 6 reads out the power spectrum data $D_{SPEC}$ for the individual DUTs 4 from the data storage 5 and analyzes it Thus, the analyzer 6 decides or judges whether or not each of the DUTs 4 includes some potential fault and will fail in an early stage. In other words, the analyzer 6 decides which one of the DUTs 4 is faulty or good using the distribution rate curves A and B, as shown in FIG. 2.

Next, the decision operation in the data analyzer or decider 6 is explained concretely below with reference to FIG. 6.

FIG. 6 is a table showing an example of the power spectrum data $D_{SPEC}$ for one of the DUTs 4, in which the data of a set of 33 LSIs or DUTs 4 (i.e., Samples 1 to 33) at the fundamental frequency and its second to 10-th harmonic frequencies are shown. Also, the mean value and standard deviation of the data $D_{SPEC}$ at each fundamental and harmonic frequency are shown in FIG. 6.

Here, the standard deviation of the data $D_{SPEC}$ at each frequency is defined as $\sigma$. At the same time as this, when one of the LSIs or DUTs 4 (i.e., Samples 1 to 33) has a value apart from its mean value by $5\sigma$ or greater at any one of the frequencies, it is decided as a faulty LSI. Then, as indicated by bold frames in FIG. 6, sample 22 has values apart from its mean value by $5\sigma$ or greater at the fundamental frequency and its second, third, sixth, seventh, and tenth harmonic frequencies. Thus, Sample 22 is decided or judged as a faulty or defective one.

Needless to say, to decide whether or not one of the LSIs or DUTs 4 (i.e., Samples 1 to 33) is faulty, it is unnecessary to have a value apart from its mean value by $5\sigma$ or greater. The reference value may be optionally determined according to the measured values of the power spectrum data $D_{SPEC}$.

As explained above, with the screening method according to the first embodiment of the invention, the faulty LSIs or DUTs 4 can be found without any burn-in test; in other words, the faulty LSIs 4 with potential failure therein can be screened out before potential failure is elicited through a burn-in test. This means that the faulty LSIs 4 with potential failure therein can be screened out in a short period of time.

SECOND EMBODIMENT

Figure 7:
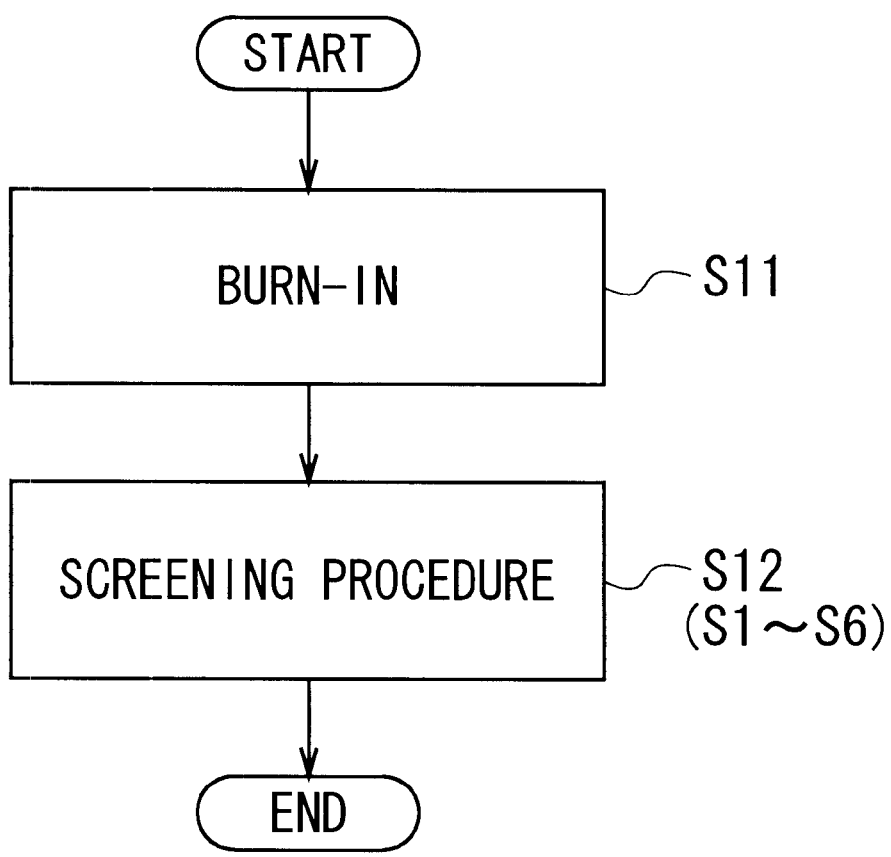
FIG. 7 is a flowchart showing the process steps of a screening method according to a second embodiment of the invention.

FIG. 7 is a flowchart showing the steps of a screening method according to a second embodiment of the invention, which is carried out by the screening apparatus according to the first embodiment of FIG. 1.

As seen from FIG. 7, the method of the second embodiment comprises a step S11 of performing a burn-in test and a step S12 of performing the screening procedure (i.e., the steps S1 to S6 in FIG. 4). In other words, the method of the second embodiment is the combination of a burn-in test and the steps S1 to S6 in the screening method according to the first embodiment.

Thus, with the screening method of the second embodiment, a burn-in test is carried out in a short period of time before the screening procedure (i.e., S1 to S6) and therefore, the potential faulty existing in the DUTs 4 tend to be elicited prior to the procedure As a result, there is an additional advantage that the faulty LSIs or DUTs 4 with potential failure therein can be screened out at a higher accuracy than the method of the first embodiment.

THIRD EMBODIMENT

Figure 8:
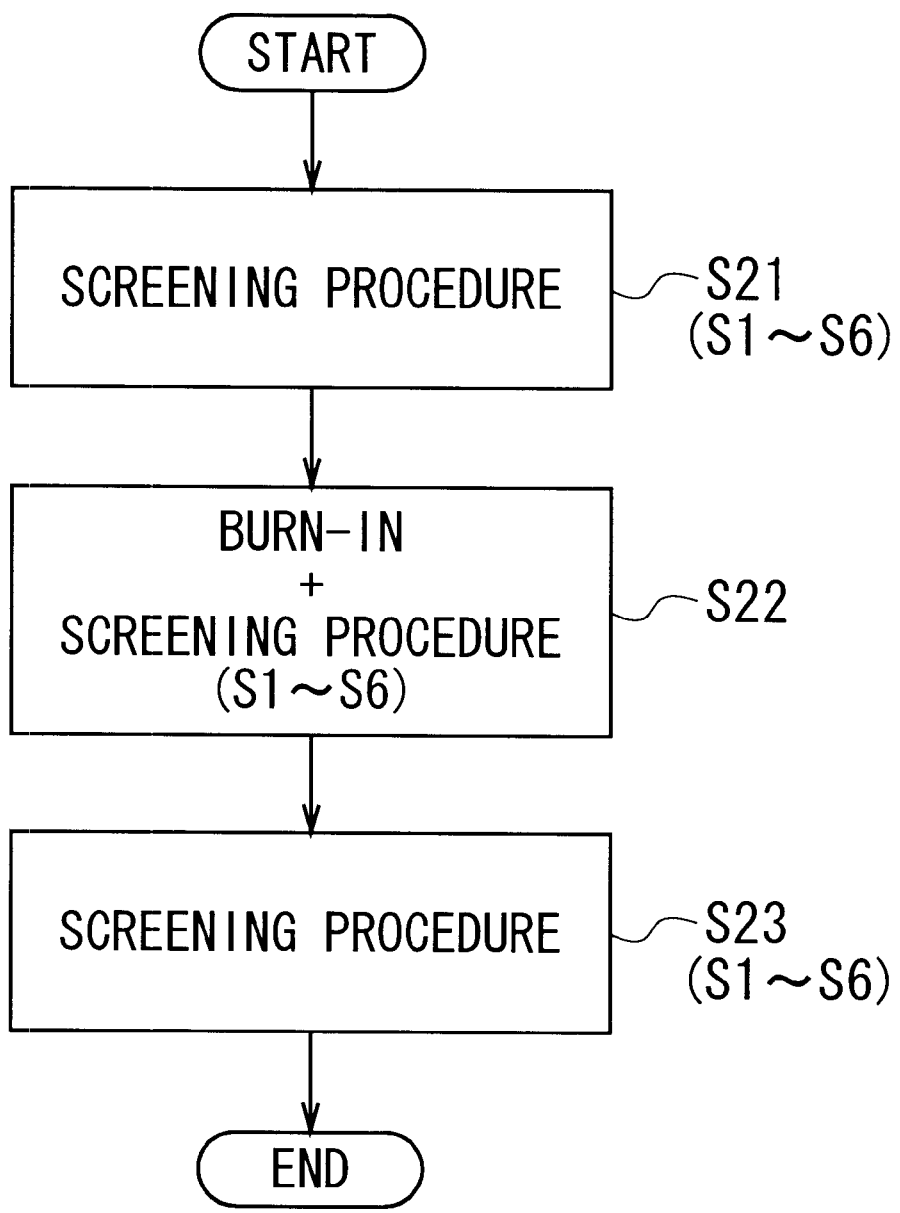
FIG. 8 is a flowchart showing the process steps of a screening method according to a third embodiment of the invention.

FIG. 8 is a flowchart showing the steps of a screening method according to a third embodiment of the invention, which is carried out by the screening apparatus according to the first embodiment of FIG. 1.

As seen from FIG. 8, the method of the third embodiment comprises a step S21 of performing the screening procedure (i.e., the steps S1 to 96 in FIG. 4), a step S22 of performing the screening procedure (i.e., the steps S1 to S6 in FIG. 4) during a burn-in test, and a step S23 of performing the screening procedure (i.e., the steps S1 to S6 in FIG. 4). In other words, the steps S1 to S6 in the screening method according to the first embodiment are carried out (the first time) in the step S21 before a burn-in test is started, the same steps S1 to S6 are carried out (the second time) during the burn-in test in the step S22, and the same steps S1 to S6 are carried out (the third time) in the step S23 after the burn-in test is completed.

Specifically, with the screening method of the third embodiment of FIG. 8, the screening procedure (i.e., S1 to S6) is carried out in the step S21 and therefore, the power spectrum data $D_{SPEC}$ is generated by the spectrum analyzer 3 and stored in the data storage 5 prior to the burn-in test. Next, the same screening procedure (i.e., S1 to S6) is carried out again while the burn-in test is carried out in the step S22. The power spectrum data $D_{SPEC}$ is generated by the spectrum analyzer 3 and stored in the data storage 5 during the burn-in test in the step S22. Finally, the same screening procedure (i.e., S1 to S6) is further carried out after the burn-in test is completed in the step S23. The power spectrum data $D_{SPEC}$ is generated by the spectrum analyzer 3 and stored in the data storage 5 after the burn-in test in the step S23.

Thereafter, the data analyzer or decider 6 calculates the temporal (or, time-dependent) change rate of the power spectrum data $D_{SPEC}$ obtained in the steps S21, S22 and S23. Then, the analyzer 6 decides or judges whether or not each of the DUTs 4 includes some potential Fault and will fail in an early stage, in other words, the analyzer 6 decides which one of the DUTs 4 is faulty or good. The decision operation in the analyzer 6 is based on whether or not the temporal change rate of the power spectrum data $D_{SPEC}$ before, during and after the burn-in test is equal to or greater than a specific reference value.

Figure 9:
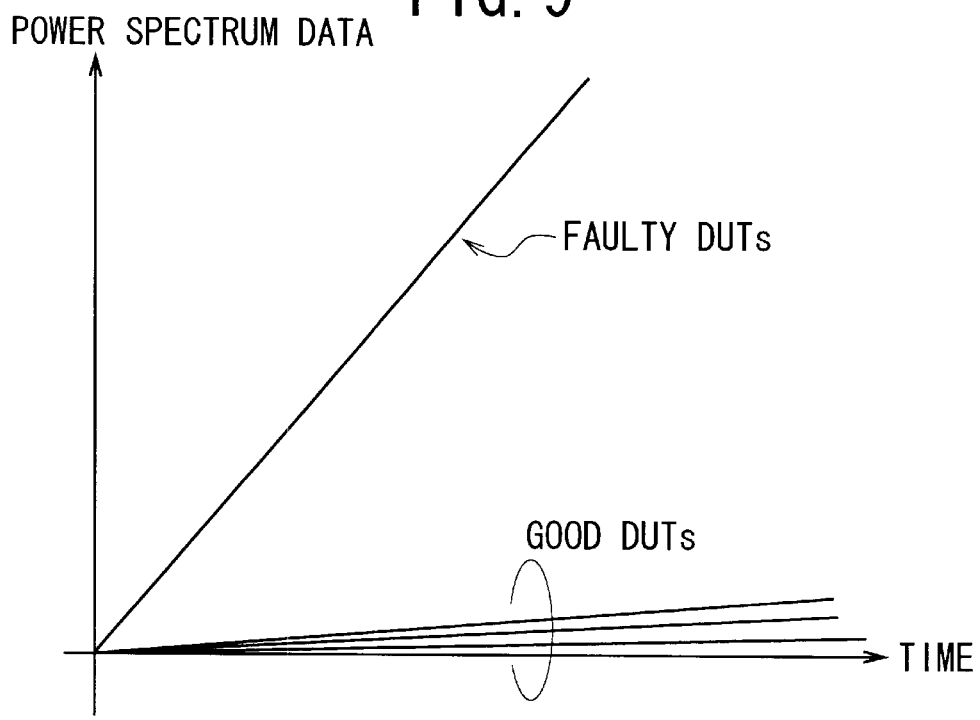
FIG. 9 is a graph showing an example of the time-dependent change of the power spectrum data of the power supply currents of the semiconductor integrated circuit devices under test obtained in the method according to the third embodiment of FIG. 8.

FIG. 9 shows schematically an example of the time-dependent change of the power spectrum data $D_{SPEC}$ of the DUTs 4 before, during and after the burn-in test.

As seen from FIG. 9, the good DUTs 4 have small time-dependent change rates of the data $D_{SPEC}$ before, during, and after the burn-in test. This is because the good DUTs 4 include no potential fault or defect and therefore, they scarcely degrade in performance or characteristics even after the burn-in test is completed. Thus, the values of the data $D_{SPEC}$ do not increase or scarcely increase with time. In contrast, the faulty DUTs 4 have large time-dependent change rates of the data $D_{SPEC}$ before, during, and after the burn-in test. This is because the faulty DUTs 4 include some potential fault or defect and therefore, they distinctly degrade in performance or characteristics after the burn-in test is completed. Thus, the values of the data $D_{SPEC}$ increase largely with time.

Accordingly, whether or not the DUTs 4 are faulty can be found by detecting or finding whether or not the temporal change rate of the power spectrum data $D_{SPEC}$ is greater than a specific reference value. Based on this reference, the faulty LSIs or DUTs 4 are clearly distinguishable from the good ones.

With the screening method according to the third embodiment, if the DUTs 4 have some potential fault, the situation that the potential fault becomes worse as the burn-in test progresses can be observed by way of the time-dependent change of the power spectrum data $D_{SPEC}$ of the power supply currents of the individual DUTs 4. This means that the situation of the potential fault becoming worse can be known during the screening method. Accordingly, there is an additional advantage that the faulty DUTs 4 can be screening out more accurately.

FOURTH EMBODIMENT

Figure 10:
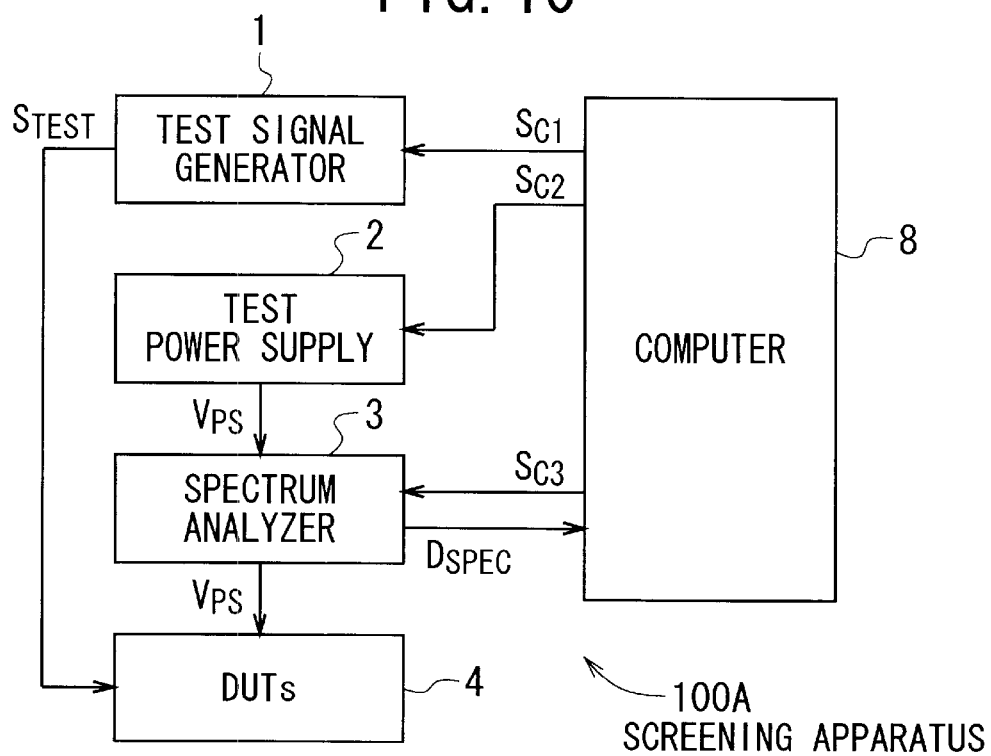
FIG. 10 is a functional block diagram showing the configuration of a screening apparatus according to a fourth embodiment of the invention.

FIG. 10 shows a screening apparatus 100A according to a fourth embodiment of the invention, which is used to perform one of the above-described screening methods of the first to third embodiments.

The screening apparatus 100A has a configuration obtained by replacing the combination of the data storage 5, the data analyzer or decider 6, and the main controller 7 with a computer 8 in the screening apparatus 100 according to the first embodiment of FIG. 1. Therefore, the explanation about the configuration of the apparatus 100A is omitted here.

Figure 11:
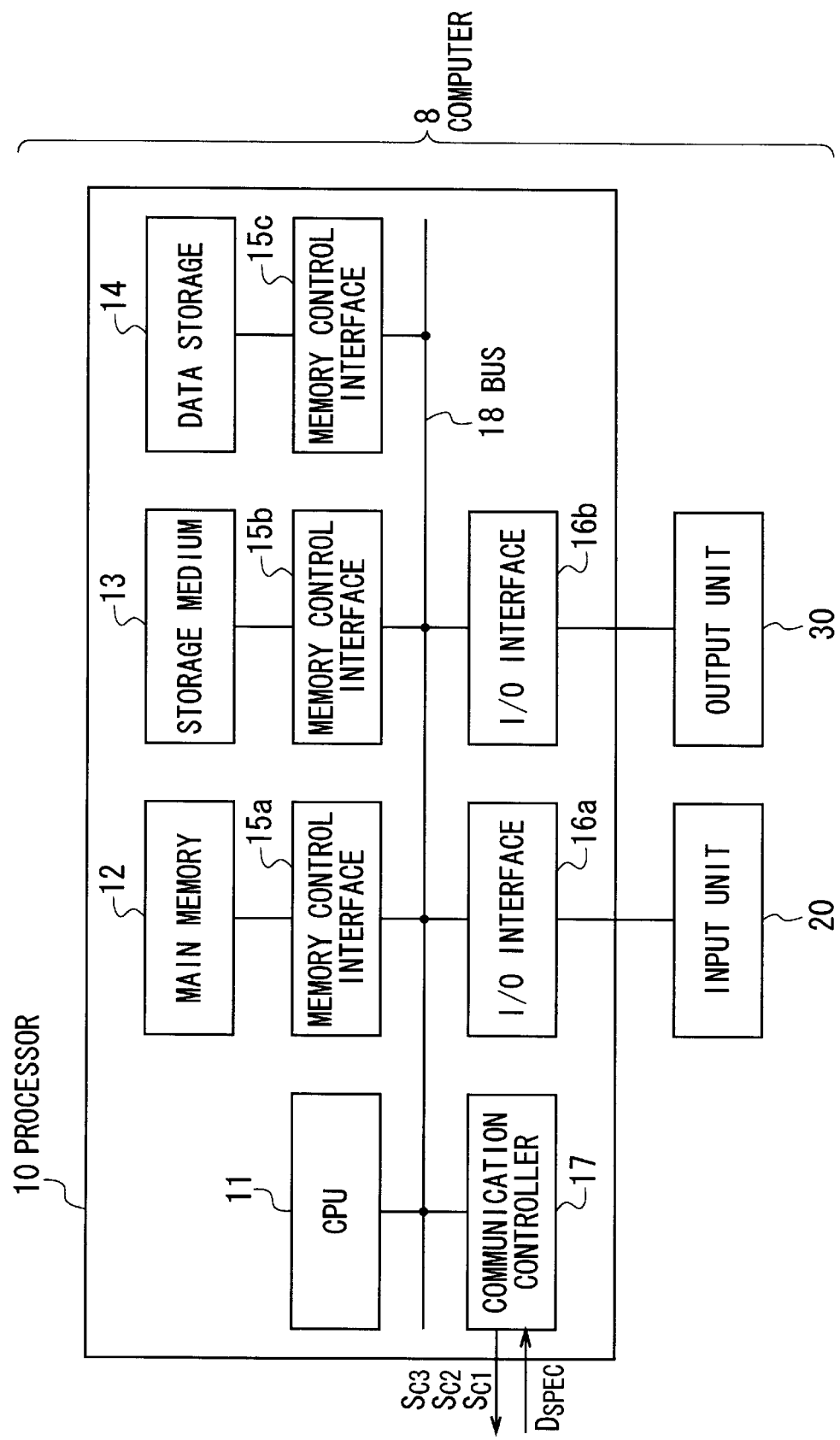
FIG. 11 is a functional block diagram showing the configuration of the computer used in the apparatus according to the fourth embodiment of FIG. 11.

In the apparatus 100A, as shown in FIG. 11, the computer 8 comprises a processor 10, an input unit 20 for inputting various commands and/or data into the processor 10, and an output unit 30 for monitoring the processing result of the processor 10.

The processor 10 comprises a Central Processing Unit (CPU) 11, a main memory 12, a storage medium 13, a data storage 14, memory control interfaces 15a, 15b, and 15c, Input/Output (I/O) interfaces 16a and 16b, and a communication controller 17, which are connected to each other by way of a bus 18.

The CPU 11 controls the whole operation of the processor 10. The main memory 12 stores temporarily the information or data necessary for the processing in the CPU 11. The storage medium 13 stores a specific control program for controlling the operations of the test signal generator 1, the test power supply 2, and the spectrum analyzer 3 by way of the CPU 11, thereby performing the screen method of the first, second, or third embodiment.

The data storage 14 stores the power spectrum data $D_{SPEC}$ of the power supply currents of the respective LSIs or DUTs 4 calculated by the spectrum analyzer 3. The memory control interfaces 15a, 15b, and 15c control the data transfer operation for the main memory 12, the storage medium 13, and the data storage 14. The I/O interfaces 16a and 16b provide interface between the input and output units 20 and 30 and the processor 10. The communication controller 17 controls the communication operation of the various data or information between the processor 10 and the combination of the test signal generator 1, the test power supply 2, and the spectrum analyzer 3.

The processor 10 serves to control the operation of the test signal generator 1, the test power supply 2, and the spectrum analyzer 3 by way of the control signals $S_{C1}$, $S_{C2}$, and $S_{C3}$, respectively, which is carried out according to the control program recorded in the storage medium 13. Moreover, the processor 10 provides the operation of the data storage 5 and the data analyzer or decider 6. These operations are carried out in the same way as any one of the screening methods according to the first to third embodiments.

As the storage medium 13, it is needless to say that a magnetic disk, a semiconductor memory, an optical disk, or any other data-recording medium may be used With the screening apparatus 100A according to the fourth embodiment of FIGS. 10 and 11, any one of the screening methods according to the first to third embodiments can be performed. Thus, there are the same advantages as those in the first embodiment.

In the present invention, any type of semiconductor integrated circuit devices may be used as the DUTs 4 if they provide power spectrum data of power supply currents varying corresponding to the supplied power supply voltage and the applied test signal.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A method of screening semiconductor integrated circuit devices, comprising the steps of:
    (a) supplying a specific power supply voltage to semiconductor integrated circuit devices to be tested while applying a specific test signal to the devices at a specific period;
    (b) observing power supply currents of the devices caused by the power supply voltage and the test signal;
    (c) generating sets of power spectrum data of the power supply currents of the devices corresponding to the test signal;
    (d) generating distributions of the sets of power spectrum data of the power supply currents; and
    (e) judging whether or not the distributions of the sets of power spectrum data of the power supply currents are equal to or greater than a specific reference value;
        wherein when the distribution of the set of power spectrum data of the power supply current of one of the devices is equal to or greater than the reference value, the device in question is regarded as a faulty one.

2. The method according to claim 1, further comprising a step of performing a burn-in test for the devices prior to the step (a).

3. The method according to claim 1, wherein the test signal includes a single set of test patterns.

4. The method according to claim 1, wherein the test signal includes sets of test patterns that are consecutively arranged with time.

5. The method according to claim 1, wherein the test signal includes sets of test patterns that are consecutively arranged with time at specific intervals.

6. A method of screening semiconductor integrated circuit devices, comprising the steps of:
(a) supplying a specific power supply voltage to semiconductor integrated circuit devices to be tested while applying a specific test signal to the devices at a specific period;
(b) observing power supply currents of the devices caused by the power supply voltage and the test signal,
(c) generating sets of power spectrum data of the power supply currents of the devices corresponding to the test signal;
(d) generating distributions of the sets of power spectrum data of the power supply currents before a burn-in test;
(e) performing the steps (a) to (d) while performing a burn-in test for the devices after the step (d), generating distributions of the sets of power spectrum data of the power supply currents during the burn-in test;
(f) performing the steps (a) to (d) after the burn-in test is completed in the step (e), generating distributions of the sets of power spectrum data of the power supply currents after the burn-in test,
(g) generating distribution change rates of power spectrum data of the power supply currents based on the distributions of the sets of power spectrum data of the power supply currents obtained in the steps (d), (e), and (f); and
(h) judging whether or not the distribution change rates of power spectrum data of the power supply currants generated in the step (g) are equal to or greater than a specific reference value;
wherein when the distribution change rate of power spectrum data of the power supply current of one of the devices is equal to or greater than the reference value, the device in question is regarded as a faulty one.

7. The method according to claim 6, wherein the test signal includes a single set of test patterns.

8. The method according to claim 6, wherein the test signal includes sets of test patterns that are consecutively arranged with time.

9. The method according to claim 6, wherein the test signal includes sets of test patterns that are consecutively arranged with time at specific intervals.

10. An apparatus for screening semiconductor integrated circuit devices, comprising:
(a) a test power supply for generating a power supply voltage applied to semiconductor integrated circuit devices to be tested;
(b) a test signal generator for generating a test signal supplied to the devices;
(c) a spectrum analyzer for observing power supply currents of the devices caused by the power supply voltage and the test signal and for generating sets of power spectrum data of the power supply currents of the devices corresponding to the test signal;
(d) a data storage for storing the sets of power spectrum data of the power supply currents of the devices; and
(e) a data analyzer for generating distributions of the sets of power spectrum data of the power supply currents and for judging whether or not the distributions of the sets of power spectrum data of the power supply currents are equal to or greater than a specific reference value;
wherein when the distribution of the set of power spectrum data of the power supply current of one of the devices is equal to or greater than the reference value, the device in question is regarded as a faulty one.

11. A computer program product having a computer readable medium and a computer program recorded thereon, the computer program being operable to screen semiconductor integrated circuit devices;
the product comprising:
(a) code that supplies a specific power supply voltage to semiconductor integrated circuit devices to be tested while applying a specific test signal to the devices at a specific period;
(b) code that observes power supply currents of the devices caused by the power supply voltage and the test signal;
(c) code that generates sets of power spectrum data of the power supply currents of the devices corresponding to the test signal;
(d) code that generates distributions of the sets of power spectrum data of the power supply currents; and
(e) code that judges whether or not the distributions of the sets of power spectrum data of the power supply currents are equal to or greater than a specific reference value:
wherein when the distribution of the set of power spectrum data of the power supply current of one of the devices is equal to or greater than the reference value, the device in question is regarded as a faulty one.

12. The product according to claim 11, further comprising code that performs a burn-in test for the devices prior to the code (a).

13. The product according to claim 11, wherein the test signal includes a single set of test patterns.

14. The product according to claim 11, wherein the test signal includes sets of test patterns that are consecutively arranged with time.

15. The product according to claim 11, wherein the test signal includes sets of test patterns that are consecutively arranged with time at specific intervals.

16. A computer program product having a computer readable medium and a computer program recorded thereon, the computer program being operable to screen semiconductor integrated circuit devices;
the product comprising:
(a) code that supplies a specific power supply voltage to semiconductor integrated circuit devices to be tested while applying a specific test signal to the devices at a specific period;
(b) code that observes power supply currents of the devices caused by the power supply voltage and the test signal;
(c) code that generates sets of power spectrum data of the power supply currents of the devices corresponding to the test signal;
(d) code that generates distributions of the sets of power spectrum data of the power supply currents before a burn-in test;
(e) code that performs the steps (a) to (d) while performing a burn-in test for the devices after the step (d), generating distributions of the sets of power spectrum data of the power supply currents during the burn-in test;
(f) code that performs the steps (a) to (d) after the burn-in test is completed in the step (e), generating distributions of the sets of power spectrum data of the power supply currents after the burn-in test;

(g) code that generates distribution change rates of power spectrum data of the power supply currents based on the distributions of the sets of power spectrum data of the power supply currents obtained in the steps (d), (e), and (f); and (h) code that judges whether or not the distribution change rates of power spectrum data of the power supply currents generated in the step (g) are equal to or greater than a specific reference value;

wherein when the distribution change rate of power spectrum data of the power supply current of one of the devices is equal to or greater than the reference value, the device in question is regarded as a faulty one.

17. The product according to claim 16, wherein the test signal includes a single set of test patterns.

18. The product according to claim 16, wherein the test signal includes sets of test patterns that are consecutively arranged with time.

19. The product according to claim 16, wherein the test signal includes sets of test patterns that are consecutively arranged with time at specific intervals.

* * * * *